United States Patent
Horiuchi et al.

(10) Patent No.: US 7,403,885 B2
(45) Date of Patent: Jul. 22, 2008

(54) VOLTAGE SUPPLY NOISE ANALYSIS

(75) Inventors: Aaron Keiichi Horiuchi, Thornton, CO (US); Clark Douglas Burnside, Fort Collins, CO (US); Stephen LaMar Dixon, Fort Collins, CO (US); David Paul Hannum, Fort Collins, CO (US); Justin Allan Coppin, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 516 days.

(21) Appl. No.: 10/982,659

(22) Filed: Nov. 5, 2004

(65) Prior Publication Data

US 2006/0100839 A1      May 11, 2006

(51) Int. Cl.
*G06F 17/50*      (2006.01)
(52) U.S. Cl. ............................... 703/14; 703/2; 703/19; 716/5; 716/6
(58) Field of Classification Search ............ 703/13, 703/14, 2, 19, 20; 716/4–6
See application file for complete search history.

(56) References Cited

U.S. PATENT DOCUMENTS

| | | | |
|---|---|---|---|
| 5,706,206 A * | 1/1998 | Hammer et al. ............. | 716/4 |
| 6,061,222 A | 5/2000 | Morris et al. | |
| 6,072,740 A | 6/2000 | Borkar | |
| 6,111,804 A | 8/2000 | Borkar | |
| 6,138,267 A * | 10/2000 | Murai ....................... | 716/5 |
| 6,266,288 B1 | 7/2001 | Borkar | |
| 6,291,322 B1 | 9/2001 | Clement | |
| 6,725,185 B2 | 4/2004 | Clement | |

OTHER PUBLICATIONS

Zhao, Shiyou and Kaushik Roy. "Estimation of Switching NOise on POwer Supply Lines in Deep Sub-micron CMOS Circuits." IEEE 2000.*
IBM, "ASIC Products Application Note: Cu-11 HSS Noise Analysis," May 16, 2003, pp. 1-20.
Jasmin, "Noise Analysis for ASIC Design using HSS Cores," Feb. 26, 2002, pp. 1-42.

* cited by examiner

*Primary Examiner*—Russell Frejd

(57) ABSTRACT

Systems and methods for implementing voltage supply noise analysis for electronic circuits are disclosed. In an exemplary embodiment a computer program product executes a computer process. The computer process generates at least one spatial profile for the electronic circuit, generates at least one temporal profile for the electronic circuit, merges the at least one temporal profile and the at least one spatial profile, and determines if the electronic circuit is operating within acceptable voltage noise margins based on the merged temporal and spatial profiles.

17 Claims, 8 Drawing Sheets

VOLTAGE SUPPLY NOISE ANALYSIS

TECHNICAL FIELD

The described subject matter relates to electronic circuits, and more particularly to implementing voltage supply noise analysis for electronic circuits.

BACKGROUND

High performance electronic circuits, such as integrated circuits (ICs) and microprocessors, are designed to operate within specified voltage supply boundaries. If the circuit is operated outside the specified voltage supply boundaries the circuit may not function properly (e.g., introducing noise, improper signal timing, etc.) or the circuit may even be damaged.

When designing electronic circuits, the designers typically assume voltage supply boundaries for proper operation of the circuit and use generic circuit design tools to test whether these assumptions are correct. However, generic circuit design tools are typically focused on other aspects of circuit design and may not provide an accurate understanding of circuit operation for testing voltage supply assumptions. In addition, these tools may be useless if the wrong assumptions are being tested.

Noise analysis models are also available which utilize statistical characterization of combinational logic to model and test voltage supplies for electronic circuits. However, these models assume a general power and capacitance density spread uniformly over the circuit without regard for which parts of the circuit are drawing the most current. In addition, these models do not account for changes in power dissipation within a clock cycle.

As a result, the electronic circuits may experience unacceptable voltage supply noise. Considerable time and effort may then be spent debugging the circuits, delaying introduction of the electronic circuit in the marketplace and increasing the cost of the circuit when it is introduced.

SUMMARY

An exemplary embodiment of voltage supply noise analysis for electronic circuits may be implemented in a computer program product encoding a computer program for executing a computer process. The computer process may comprise: generating at least one spatial profile for the electronic circuit, generating at least one temporal profile for the electronic circuit, merging the at least one temporal profile and the at least one spatial profile, and determining if the electronic circuit is operating within acceptable voltage noise margins based on the merged temporal and spatial profiles.

In another exemplary embodiment, voltage supply noise analysis for electronic circuits may be implemented as a method, comprising: generating at least one spatial profile including a plurality of grid elements representing components in the electronic circuit, generating at least one temporal profile representing activity of components in the electronic circuit, merging the at least one temporal profile and the at least one spatial profile, and automatically determining if the electronic circuit is operating within acceptable voltage noise margins based on the merged temporal and spatial profiles

DETAILED DESCRIPTION

Briefly, voltage supply noise analysis may be implemented to find and address unacceptable power supply noise in electronic circuits. Exemplary analysis may include generating one or more spatial profiles and one or more temporal profiles for the electronic circuit. These profiles may be used for detailed and circuit-specific noise evaluation, e.g., at the die, package, and/or board levels of an integrated circuit. The operations described herein may be used by circuit designers in the laboratory/test environment for optimum power supply configuration.

It is noted that operations described herein may be embodied as logic instructions on a computer-readable medium. When executed on a processor, the logic instructions cause a general purpose computing device to be programmed as a special-purpose machine that implements the described operations.

Exemplary System

Figure 1:
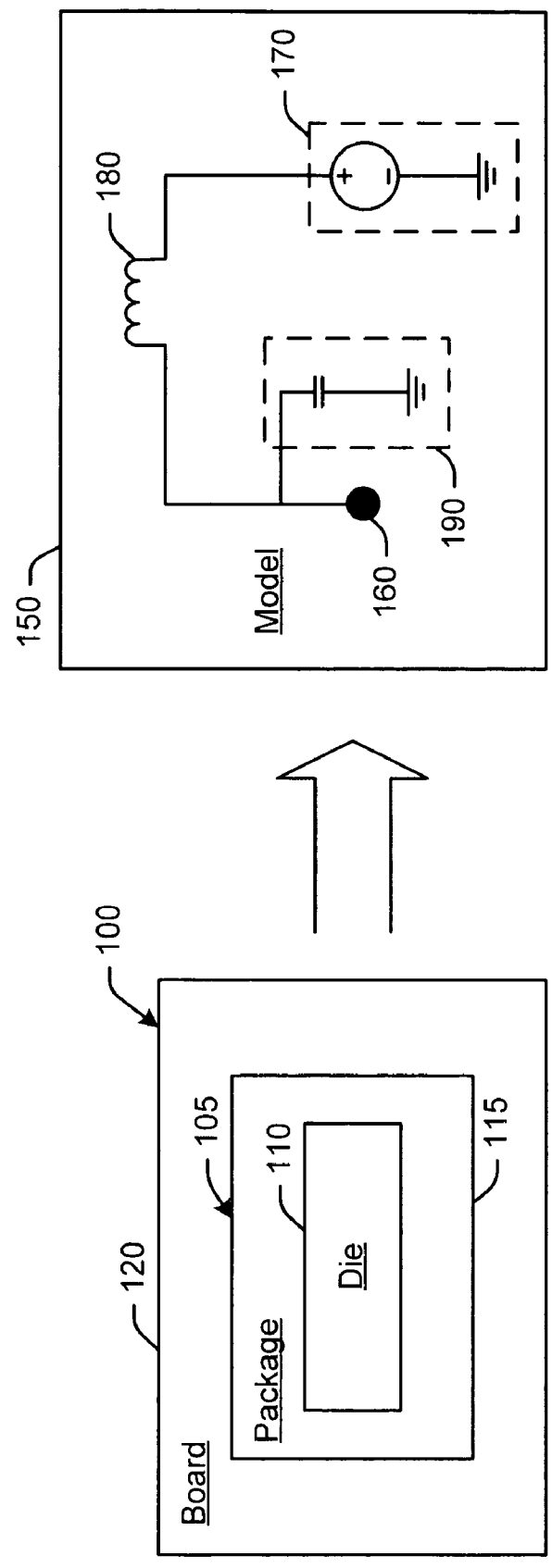
FIG. 1 is a schematic illustration of an exemplary electronic circuit and a simplified voltage supply model.

FIG. 1 is a high-level illustration of an exemplary electronic circuit 105 including an integrated circuit (IC) 105, such as an application specific integrated circuit (ASIC). Integrated circuits may be classified as analog, digital, or hybrid and are commonplace in electronic devices ranging from computers to mobile phones. The small size of integrated circuits allows operation at high speeds with low power dissipation.

Integrated circuit 105 may be fabricated with millions of components (primarily transistors) on a silicon die 110. Different areas of the die 110 substrate may be doped to make these areas p-type or n-type. Aluminum tracks may be etched into layers of silicon deposited over the surface of the die 110. The die 110 then may be mounted in a package 115 and is electrically connected, e.g., using gold wires to connect pads around the edge of the die 110 to pads around the edge of the package 115. The integrated circuit 105 may then be mounted to a circuit board 120 along with other electronic circuitry.

Operation of complex electrical circuitry, such as integrated circuits, may often be modeled using simpler and more readily understood electronic circuits. An exemplary model 150 of the electronic circuit 100 is shown in FIG. 1. Node 160 may represent one or more components of the electronic circuit 100 such as, e.g., the integrated circuit 105, die 110, package 115, board 120, or any combination thereof.

A power supply 170 may be connected to node 160 to model voltage supply noise characteristics of the electronic circuit 100. For example, voltage supply boundaries may be tested by adding an inductive load 180 and/or a capacitive load 190. Inductive load 180 and/or capacitive load 190 may be added at any one or more levels of the electronic circuit 100 to enhance power filter characteristics and reduce power noise and electromagnetic interference (EMI) during operation. Voltage supply noise analysis is described in more detail below and may be used to determine the effectiveness of adding an inductive load 180 and/or capacitive load 190, in addition to how much should be added and where it should be added in the electronic circuit 100.

Before continuing, it is noted that voltage supply noise analysis may be used for any of a wide variety of different types of electronic circuits and is not limited to integrated circuits. For example, Field-Programmable Gate Array (FPGA) logic chips or other gate arrays may be analyzed along with multi-chip circuits, and processors, to name only a few examples.

Figure 2:
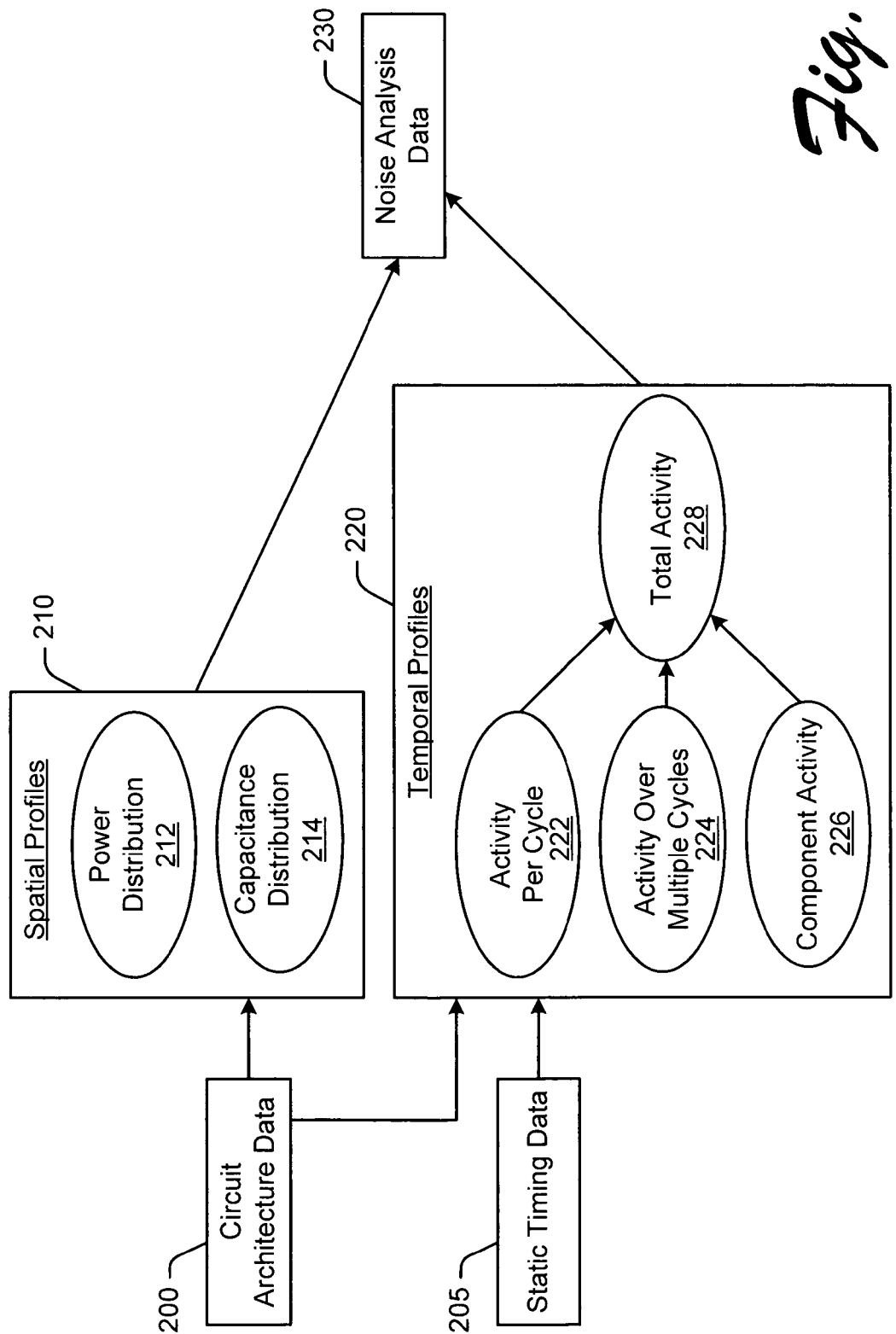
FIG. 2 is a schematic illustration of an exemplary embodiment of voltage supply noise analysis.

FIG. 2 is a schematic illustration of exemplary voltage supply noise analysis. In an exemplary embodiment, circuit architecture data 200 is used to generate spatial profiles 210. Circuit architecture data 200 may be provided by the circuit designer and may include information about the electronic circuit, such as but not limited to, chip floor plan, circuit components, and operational parameters. Circuit architecture data 200 and static timing data 205 may be used to generate temporal profiles 220.

Spatial profiles 210 and temporal profiles 220 may be merged to generate voltage supply noise analysis output 230. Voltage supply noise analysis output 230 may be analyzed to determine whether an electronic circuit is operating within acceptable voltage supply noise margins, e.g., as specified by the circuit designer.

Spatial profiles 210 may be generated by dividing an electronic circuit into a plurality of grid elements, each grid element representing one or more components of the electronic circuit. In an exemplary embodiment, spatial profiles 210 may include a power distribution profile 212 and a capacitance distribution profile 214. Power distribution profile includes power dissipation data for each grid element. Capacitance distribution profile 214 includes intrinsic and/or extrinsic capacitance data for each grid element. Exemplary spatial profiles are discussed below with reference to FIGS. 3(a) and (b).

Temporal profiles may be generated based on circuit activity data for the electronic circuit or components thereof, e.g., based on data from actual or modeled circuit operations. Temporal profiles 220 may include one or more activity profiles for the circuit. For example, data may include circuit activity for a single clock cycle 222, multiple clock cycles 224, and for individual components or groups of components 226. Activity profiles 222, 224, 226 may be combined to generate a total activity profile 228. Exemplary temporal profiles are discussed below with reference to FIGS. 4(a) and (b) and FIG. 5.

Figure 3A:
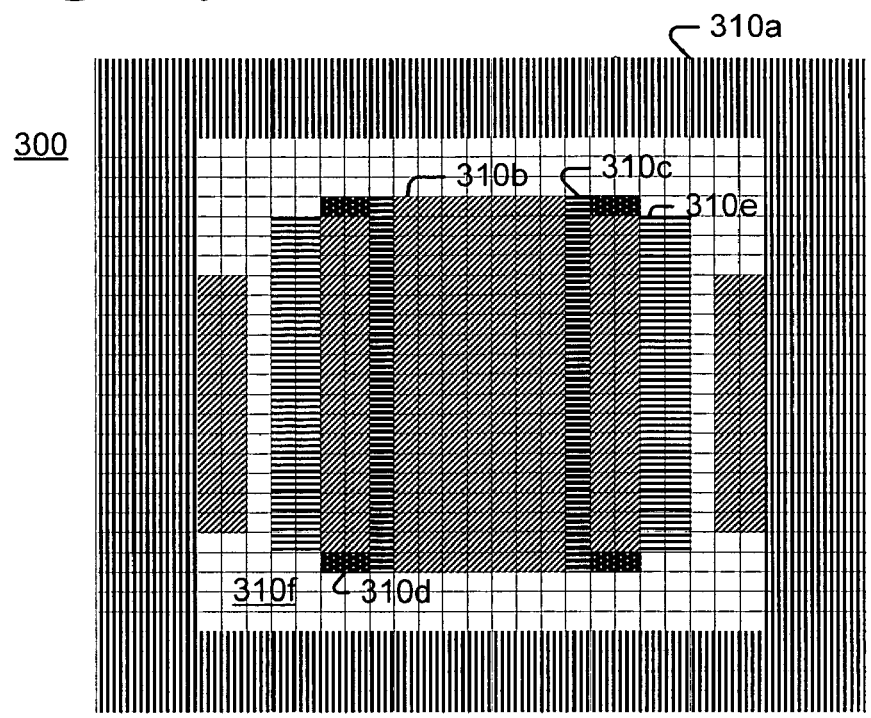
FIGS. 3(a) and (b) are exemplary spatial profiles of an electronic circuit showing (a) power dissipation, and (b) capacitance.

FIGS. 3(a) and (b) are exemplary spatial profiles of an electronic circuit showing (a) power dissipation, and (b) capacitance. Spatial profiles 300, 350 may be generated based on the layout or "floor plan" of the circuit under consideration. Spatial profiles 300, 350 may include a plurality of grid elements, each grid element representing one or more components in the circuit, such as e.g., a flip flop, logic gate, etc. It is noted that any suitable number of grid elements may be used to generate spatial profiles 300, 350.

Power dissipation data may be assigned to each grid element in spatial profile 300. Power dissipation in a digital circuit may be determined using Ohm's Law:

$$P(t) = i(t) * v(t) \quad \text{EQN 1:}$$

Where:
    P(t)=Power as a function of time (t);
    i(t)=Current as a function of time (t); and
    v(t)=Voltage as a function of time (t).

Numeric data for these variables may be determined using calculations, computer simulations, or actual measurements. Power dissipation for an exemplary circuit is illustrated in FIG. 3(a) and corresponding power dissipation data is provided for grid areas 310a-f in Table 1.

TABLE 1

| Power Dissipation | |
| --- | --- |
| Grid Reference No. | Power Dissipation (W/mm$^2$) |
| 310a | >0.05 |
| 310b | >0.02 to 0.03 |
| 310c | >0.01 to 0.02 |
| 310d | >0.03 to 0.04 |
| 310e | >0.04 to 0.05 |
| 310f | ≦0.01 |

Figure 3B:
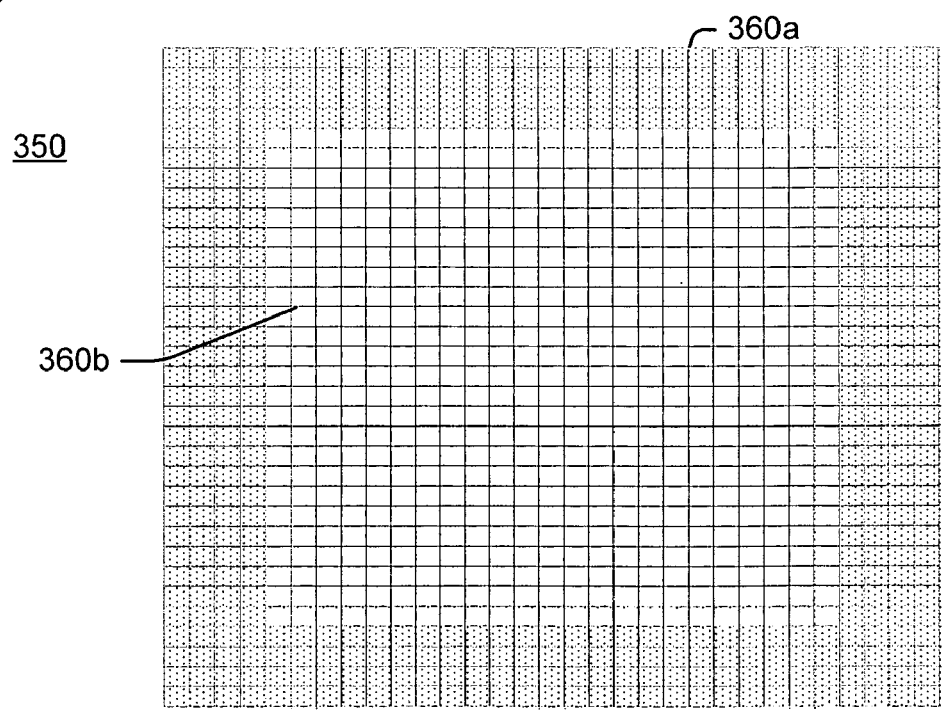

Capacitance data may be assigned to each grid element in spatial profile 350. Capacitance data may include extrinsic capacitance, e.g., from capacitance cells on the chip. Capacitance data may also include intrinsic (or parasitic) capacitance, e.g., wire capacitance. Capacitance for an exemplary circuit is illustrated in FIG. 3(b) and corresponding capacitance data is provided for grid areas 360a-b in Table 2.

TABLE 2

| Capacitance | |
| --- | --- |
| Grid Reference No. | Capacitance (nF/mm$^2$) |
| 360a | >0.15 to 0.20 |
| 360b | >0.05 to 0.10 |

It is noted that spatial profiles 300, 350 and corresponding power dissipation and capacitance data are provided herein as illustrative of spatial data for an exemplary circuit and are not intended to be limiting.

Figure 4A:
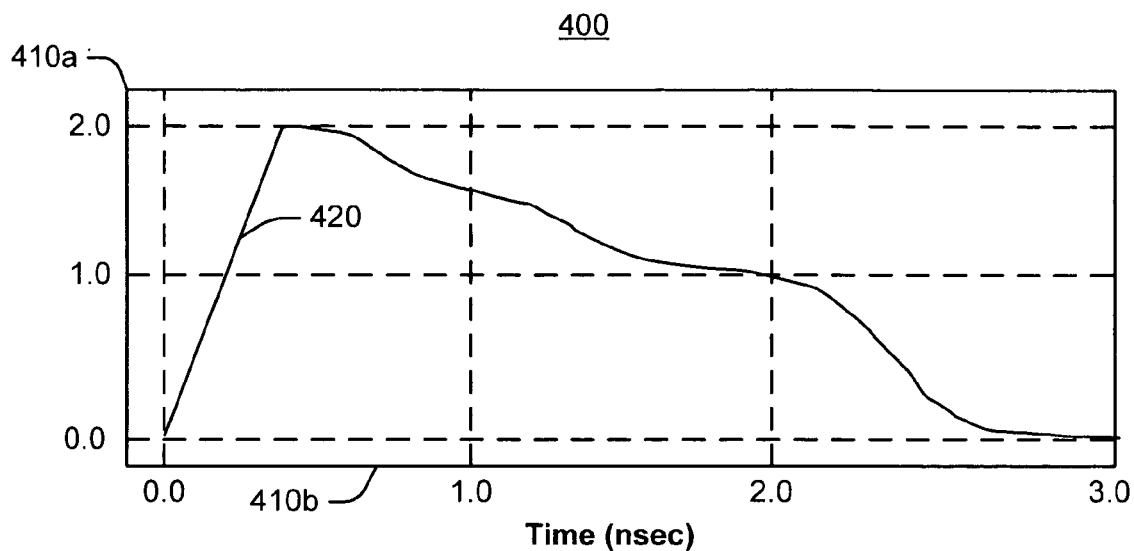
FIGS. 4(a) and (b) are exemplary temporal profiles of an electronic circuit showing (a) circuit activity during a single clock cycle, and (b) circuit activity during multiple clock cycles.

FIGS. 4(a) and (b) are exemplary temporal timing diagrams of a circuit showing (a) a timing profile for a single clock cycle, and (b) a timing profile for multiple clock cycles. In FIGS. 4(a) and (b), the x-axis represents time and the y-axis is normalized current (i.e., the integral of the waveform is equal to 1).

FIG. 4(a) illustrates an exemplary timing profile 400 for a single clock cycle when the electronic circuit is operating at 333 MHz. Static timing data may be used to produce a timing profile representing core logic activity during the clock cycle.

Data paths on the electronic circuit may be sampled using any suitable static timing tool, such as but not limited to, the EinsTimer™ signal propagation tool readily commercially available from IBM Corporation (New York 10504). EinsTimer™ may be used to propagate signals through the circuit, adding up delays along the paths. EinsTimer™ computes arrival times for rising and falling edges in the circuit and can identify slow and fast paths.

Figure 4B:
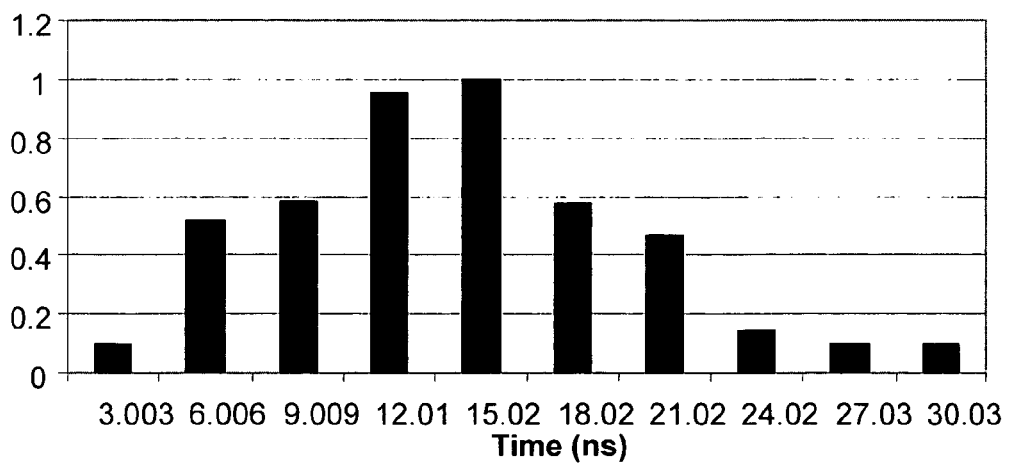

FIG. 4(b) illustrates an exemplary timing profile 450 of an electronic circuit for multiple clock cycles, e.g., as the circuit ramps from low to high activity. In an exemplary embodiment, the timing profile 450 may be generated using the following equation:

$$y(t-iT) = a_i * \pi(t-iT) \quad \text{EQN 2:}$$

Where:
  y(t–iT)=current waveform over several clock cycles;
  $a_i$=chip activity and $0 < a_i \leq 1$;
  $\pi(t)$=per unit pulse functions;
  T=period of clock; and
  i=an integer in the set [0, 1, . . . N].

Figure 5:
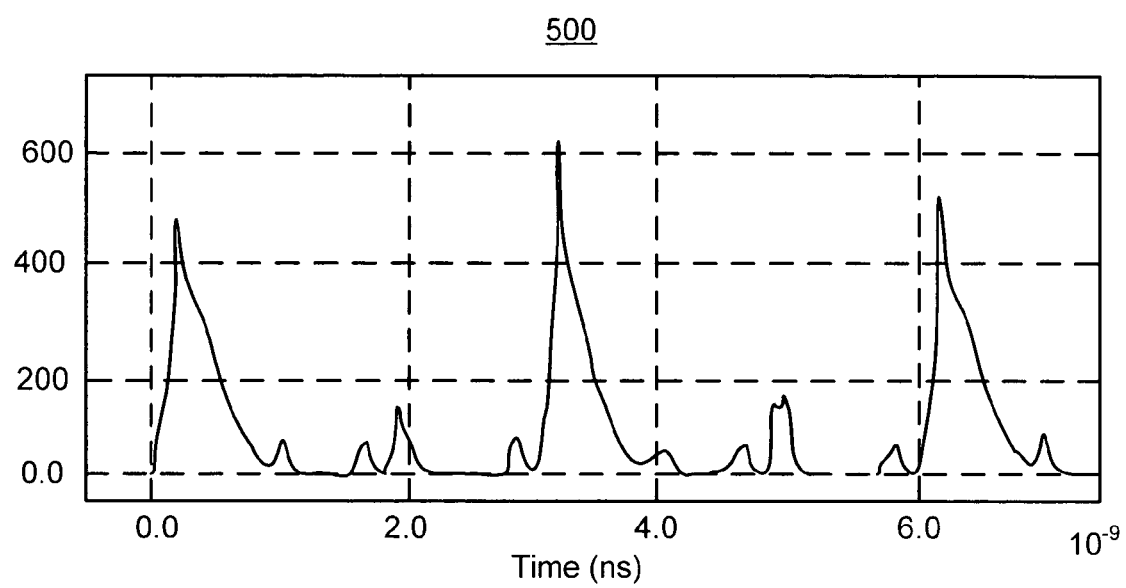
FIG. 5 is another exemplary temporal profile of an electronic circuit showing circuit activity for a circuit component.

FIG. 5 is another exemplary temporal profile of an electronic circuit showing activity for a circuit component. The x-axis represents time in nanoseconds (ns) and the y-axis represents current through the power supply. By way of example, SPICE models may be provided by component vendors for various components. The SPICE models may be used to simulate circuit operation.

Although the activity profile in FIG. 5 is for an individual circuit component (i.e., a flip-flop), it is noted that activity data may be used for any one or more circuit components including, e.g., groups of circuit components represented by a grid element or grid area in one of the spatial profiles.

Figure 6:
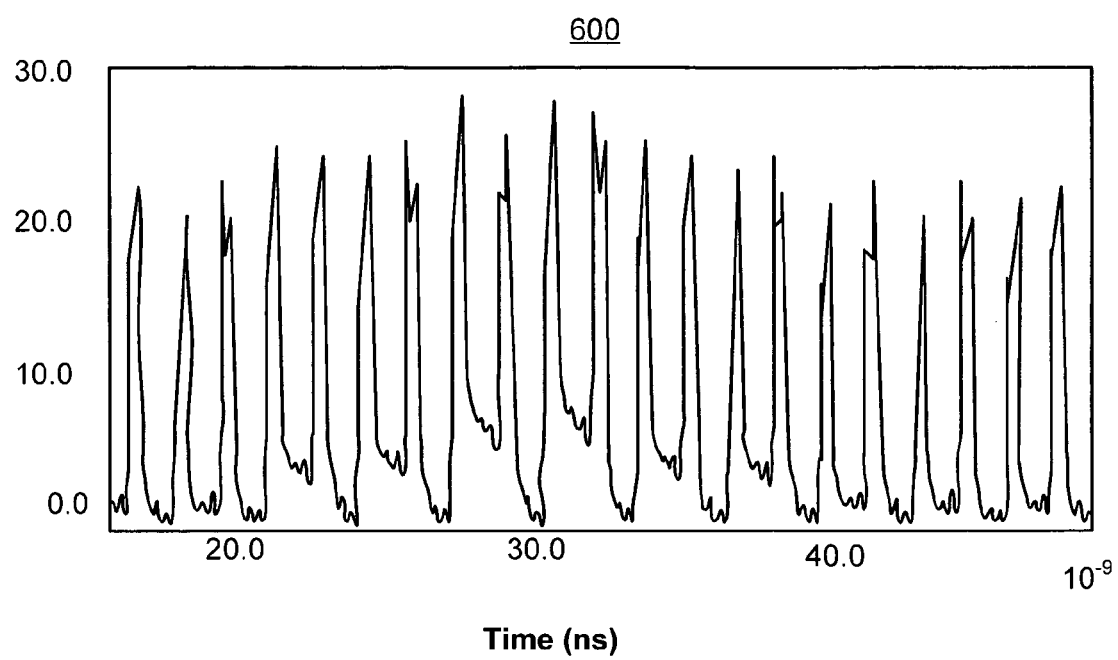
FIG. 6 is another exemplary temporal profile showing total circuit activity.

FIG. 6 is another exemplary temporal profile of an electronic circuit showing total circuit activity. In an exemplary embodiment, total circuit activity may be determined from circuit activity data for a single clock cycle, multiple clock cycles, and for one or more circuit components. For example, activity data shown in FIGS. 4(a) and (b) and FIG. 5 were combined using the following equation to generate the total chip activity data as shown in FIG. 6:

EQN 3:
$$q(t) = \sum_{i}^{N} A \cdot y(t-iT) \cdot x(t-iT) + B \cdot z(t)$$

Where:
  q(t)=total current waveform data;
  x(t–iT)=per cycle current waveform;
  z(t)=clock current waveform;
  A=Constant scaling factor that accounts for power estimates; and
  B=Constant scaling factor that accounts for total number of clocking elements.

As discussed above, temporal and spatial profiles may be merged for voltage supply noise analysis. In an exemplary embodiment, total activity data (e.g., q(t) in EQN 2, above) may be distributed over the spatial profiles with respect to each grid element according to power and capacitance distribution in the electronic circuit. For example, if $c_1+c_2+ \ldots +c_j=1$ where c represents current and j corresponds to grid element numbers, then total circuit activity may be distributed in nine grid elements as illustrated in Table 3.

TABLE 3

| Exemplary Current Distribution |
|---|
| c1 * q(t) |
| c2 * q(t) |
| c3 * q(t) |
| c4 * q(t) |
| c5 * q(t) |
| c6 * q(t) |
| c7 * q(t) |
| c8 * q(t) |
| c9 * q(t) |

It is noted that the exemplary embodiments discussed above are provided for purposes of illustration. Still other embodiments are also contemplated.

Exemplary Operations

Before describing exemplary operations, it is noted that commercially available computing devices may be utilized to implement the operations. Briefly, a general purpose computing device (or computer) may include one or more processors or processing units and computer-readable storage media. Generally, the processors are programmed by means of instructions stored at different times in the various computer-readable storage media. Computer-readable program code including the instructions may be distributed, for example, on floppy disks, CD-ROMs, or electronically, and are installed or loaded into secondary memory of the computer. At execution, the program code is loaded at least partially into the computer's primary electronic memory. Computer may also be operated in a networked environment using logical connections to one or more remote computers.

Figure 7:
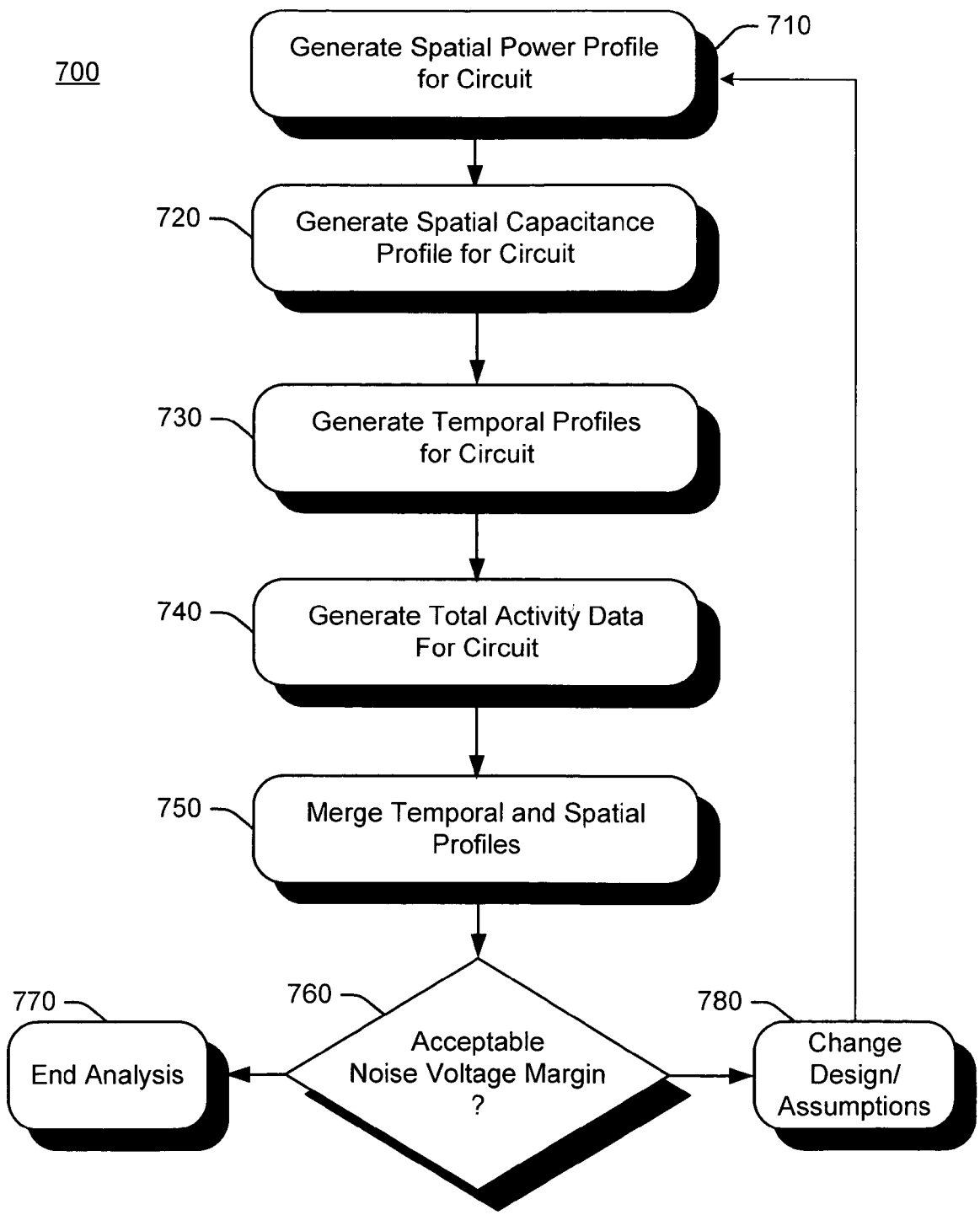
FIG. 7 is a flowchart illustrating exemplary operations to implement voltage supply noise analysis.

FIG. 7 is a flowchart illustrating exemplary operations to implement voltage supply noise analysis for electronic circuits. Operations 700 may be embodied as logic instructions on one or more computer-readable medium. When executed on a processor, the logic instructions cause a general purpose computing device to be programmed as a special-purpose machine that implements the described operations. In an exemplary embodiment, the components and connections depicted in the figures may be used to implement voltage supply noise analysis.

In operation 710, a spatial power profile for the circuit is generated. The power profile may include a plurality of grid elements each representing power dissipated by circuit components. In operation 720, a spatial capacitance profile for the circuit is generated. The capacitance profile may include a plurality of grid elements each representing extrinsic and/or intrinsic capacitance. In operation 730, temporal profiles may be generated for the circuit. In operation 740, total circuit activity data may be generated e.g., using current waveform data for each clock cycle, for multiple clock cycles, and for each circuit component or group of circuit components.

In operation 750, the temporal profiles are merged with the spatial profiles for the electronic circuit. Voltage supply noise data may be generated for each grid element. In operation 760, a determination is made if the voltage supply noise data is within acceptable margins for operation of the electronic circuit. If the voltage supply noise data is acceptable the analysis may end in operation 770. Alternatively, if the voltage supply noise data is unacceptable the analysis may continue by changing the circuit design and/or voltage supply in operation 780, and returning to operation 710 for further voltage supply noise analysis.

The operations shown and described herein are provided to illustrate exemplary embodiments of voltage supply noise analysis for electronic circuits. It is noted that the operations are not limited to the ordering shown. For example, operations 710 and 720 may proceed simultaneously. Alternatively, operation 720 may precede operation 710. In yet other embodiments, analysis may implement fewer or additional spatial profiles and/or temporal profiles. Still other operations may also be implemented to enable voltage supply noise analysis.

Exemplary Computing Device

Figure 8:
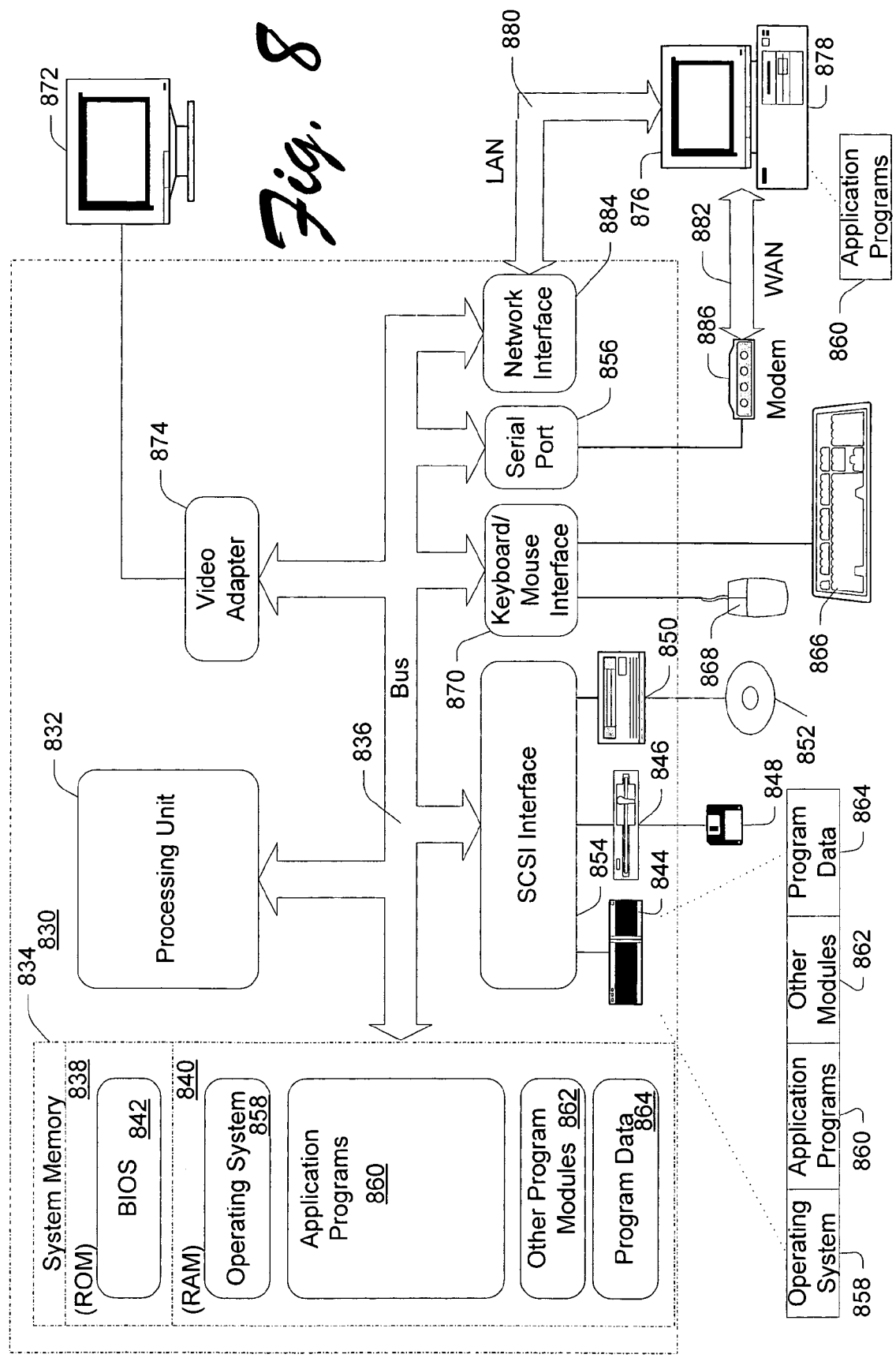
FIG. 8 is a schematic illustration of an exemplary computing device that can be utilized to implement voltage supply noise analysis.

FIG. 8 is a schematic illustration of an exemplary computing device that can be utilized to implement voltage supply noise analysis. Computing device 830 includes one or more processors or processing units 832, a system memory 834, and a bus 836 that couples various system components including the system memory 834 to processors 832. The bus 836 represents one or more of any of several types of bus structures, including a memory bus or memory controller, a peripheral bus, an accelerated graphics port, and a processor or local bus using any of a variety of bus architectures. The system memory 834 includes read only memory (ROM) 838 and random access memory (RAM) 840. A basic input/output system (BIOS) 842, containing the basic routines that help to transfer information between elements within computing device 830, such as during start-up, is stored in ROM 838.

Computing device 830 further includes a hard disk drive 844 for reading from and writing to a hard disk (not shown), and may include a magnetic disk drive 846 for reading from and writing to a removable magnetic disk 848, and an optical disk drive 850 for reading from or writing to a removable optical disk 852 such as a CD ROM or other optical media. The hard disk drive 844, magnetic disk drive 846, and optical disk drive 850 are connected to the bus 836 by a SCSI interface 854 or some other appropriate interface. The drives and their associated computer-readable media provide nonvolatile storage of computer-readable instructions, data structures, program modules and other data for computing device 830. Although the exemplary environment described herein employs a hard disk, a removable magnetic disk 848 and a removable optical disk 852, other types of computer-readable media such as magnetic cassettes, flash memory cards, digital video disks, random access memories (RAMs), read only memories (ROMs), and the like, may also be used in the exemplary operating environment.

A number of program modules may be stored on the hard disk 844, magnetic disk 848, optical disk 852, ROM 838, or RAM 840, including an operating system 858, one or more application programs 860, other program modules 862, and program data 864. A user may enter commands and information into computing device 830 through input devices such as a keyboard 866 and a pointing device 868. Other input devices (not shown) may include a microphone, joystick, game pad, satellite dish, scanner, or the like. These and other input devices are connected to the processing unit 832 through an interface 870 that is coupled to the bus 836. A monitor 872 or other type of display device is also connected to the bus 836 via an interface, such as a video adapter 874.

Computing device 830 may operate in a networked environment using logical connections to one or more remote computers, such as a remote computer 876. The remote computer 876 may be a personal computer, a server, a router, a network PC, a peer device or other common network node, and typically includes many or all of the elements described above relative to computing device 830, although only a memory storage device 878 has been illustrated in FIG. 8. The logical connections depicted include a LAN 880 and a WAN 882.

When used in a LAN networking environment, computing device 830 is connected to the local network 880 through a network interface or adapter 884. When used in a WAN networking environment, computing device 830 typically includes a modem 886 or other means for establishing communications over the wide area network 882, such as the Internet. The modem 886, which may be internal or external, is connected to the bus 836 via a serial port interface 856. In a networked environment, program modules depicted relative to the computing device 830, or portions thereof, may be stored in the remote memory storage device. It will be appreciated that the network connections shown are exemplary and other means of establishing a communications link between the computers may be used.

Generally, the data processors of computing device 830 are programmed by means of instructions stored at different times in the various computer-readable storage media of the computer. Programs and operating systems may distributed, for example, on floppy disks, CD-ROMs, or electronically, and are installed or loaded into the secondary memory of a computer. At execution, the programs are loaded at least partially into the computer's primary electronic memory.

The invention claimed is:

1. A computer program product encoding a computer program, which when executed causes a computer to execute a process for voltage supply noise analysis on an electronic circuit, the computer process comprising:
   generating at least one spatial profile for the electronic circuit, the at least one spatial profile including a capacitance distribution profile for the electronic circuit;
   generating at least one temporal profile for the electronic circuit;
   merging the at least one temporal profile and the at least one spatial profile; and
   determining if the electronic circuit is operating within acceptable voltage noise margins based on the merged temporal and spatial profiles; and
   an output device configured to generate output for a user from the computer process, the output including at least a determination if the electronic circuit is operating within acceptable voltage noise margins as determined by the computer process.

2. The computer program product of claim 1 wherein the at least one spatial profile includes a plurality of grid elements representing components of the electronic circuit.

3. The computer program product of claim 1 wherein the at least one temporal profile includes circuit activity for individual clock cycles during operation of the electronic circuit.

4. The computer program product of claim 1 wherein the at least one temporal profile includes circuit activity for multiple clock cycles during operation of the electronic circuit.

5. The computer program product of claim 1 wherein the at least one temporal profile includes circuit activity for individual components of the electronic circuit.

6. The computer program product of claim 1 wherein the computer process further comprises combining a plurality of temporal profiles to generate a total circuit activity profile for merging with the at least one spatial profile.

7. The computer program product of claim 1 wherein the at least one spatial profile includes a power distribution profile for the electronic circuit.

8. The computer program product of claim 1 wherein the capacitance distribution profile includes both intrinsic and extrinsic capacitance for the electronic circuit.

9. A method of voltage supply noise analysis on an electronic circuit comprising:
   generating at least one spatial profile including a plurality of grid elements representing components in the electronic circuit, the at least one spatial profile representing capacitance distribution for each grid element of the electronic circuit;
   generating at least one temporal profile representing circuit activity for the electronic circuit;
   merging the at least one temporal profile and the at least one spatial profile; and
   automatically determining if the electronic circuit is operating within acceptable voltage noise margins based on the merged temporal and spatial profiles.

10. The method of claim 9 further comprising generating at least one temporal profile representing circuit activity for each clock cycle during operation of the electronic circuit.

11. The method of claim 9 further comprising generating, at least one temporal profile representing circuit activity for multiple clock cycles during operation of the electronic circuit.

12. The method of claim 9 further comprising generating at least one temporal profile representing circuit activity for individual components of the electronic circuit.

13. The method of claim 9 further comprising combining a plurality of circuit activity profiles to generate a total circuit activity profile for merging with the at least one spatial profile.

14. The method of claim 9 further comprising generating at least one spatial profile representing power distribution for each grid element of the electronic circuit.

15. The method of claim 9 wherein generating at least one spatial profile representing capacitance distribution includes using both intrinsic and extrinsic capacitance data for the electronic circuit.

16. A system for voltage supply noise analysis on an electronic circuit device, comprising:

processing means and memory means operating together to execute program code, the program code including:

grid means for representing power distribution in the electronic circuit;

grid means for representing capacitance in the electronic circuit;

data means for representing circuit activity for the electronic circuit;

means for determining if the electronic circuit is operating within acceptable voltage noise margins based on the grid means and data means; and output means operatively associated with the processing means and memory means for outputting whether the electronic circuit is operating within acceptable voltage noise margins as determined by the program code.

17. The system of claim 16 wherein the data means includes means for representing total circuit activity.

* * * * *